United States Patent

Saitoh

[11] Patent Number: 5,825,690
[45] Date of Patent: Oct. 20, 1998

[54] SEMICONDUCTOR NON-VOLATILE STORAGE DEVICE HAVING VERIFICATION POTENTIAL APPLYING DEVICE FOR RE-WRITING TO INSUFFICIENTLY WRITTEN MEMORY CELLS

[75] Inventor: Kenji Saitoh, Tokyo, Japan

[73] Assignee: NEC Corporation, Tokyo, Japan

[21] Appl. No.: 586,084

[22] Filed: Jan. 16, 1996

[30] Foreign Application Priority Data

Jan. 13, 1995 [JP] Japan ................................. 7-020947

[51] Int. Cl.$^6$ ................................................. G11C 16/06
[52] U.S. Cl. ............................... 365/185.22; 365/185.24
[58] Field of Search ........................ 365/185.22, 185.17, 365/185.24, 185.25

[56] References Cited

U.S. PATENT DOCUMENTS

| | | | |
|---|---|---|---|
| 5,299,162 | 3/1994 | Kim | 365/185.22 |
| 5,357,462 | 10/1994 | Tanaka | 365/185.17 |
| 5,379,256 | 1/1995 | Tanaka | 365/185.17 |
| 5,386,422 | 1/1995 | Endoh | 365/185.17 |
| 5,452,249 | 9/1995 | Miyamoto | 365/185.24 |

FOREIGN PATENT DOCUMENTS 3-295098  12/1991  Japan ............................. G11C 16/06

Primary Examiner—David C. Nelms
Assistant Examiner—Son Mai
Attorney, Agent, or Firm—Young & Thompson

[57] ABSTRACT

A semiconductor non-volatile storage device has a memory cell array including a plurality of memory cells arranged in a form of matrix. Each of the memory cells has a charge accumulation layer and a control gate stacked on a semiconductor substrate for enabling electrical updating by increasing and decreasing of charge in the charge accumulation layer. An equal level of verification potential is applied for all of bit lines of the memory cells and a predetermined verification potential is applied to a selected control gate for performing re-writing for insufficiently written memory cells without generating data for re-writing per every verification by a logic circuit.

5 Claims, 7 Drawing Sheets

SEMICONDUCTOR NON-VOLATILE STORAGE DEVICE HAVING VERIFICATION POTENTIAL APPLYING DEVICE FOR RE-WRITING TO INSUFFICIENTLY WRITTEN MEMORY CELLS

BACKGROUND OF THE INVENTION

1. Field of the Invention

The present invention relates generally to a semiconductor integrated circuit. More specifically, the invention relates to a semiconductor non-volatile storage device.

2. Description of the Related Art

As one of EEPROM (Electrically Erasable/Programmable Read-Only-memory), NAND cell type EEPROM which can achieve high package density has been known. The NAND type EEPROM is constructed by connecting a plurality of memory cells in series with utilizing source and drain in common between adjacent memory cells to form one unit, and by connecting each unit to a bit line (Japanese Unexamined Patent Publication (Kokai) No. Heisei 3-295098).

The memory cell normally has a stacked gate structure, in which a charge accumulation layer and a control gate are stacked. The memory cell array is formed within a P-type well formed in N-type substrate or P-type substrate.

Also, the drain side end of a NAND cell is connected to a bit line via a selection gate and the source side end thereof is connected to a source line to be a reference potential via the selection gate. The control gates of the memory cells are sequentially arranged in row direction to form word lines.

The operation of writing data in the NAND type cell will be discussed hereinafter.

Here, a written condition is a condition where a threshold value $V_{TH}$ is a positive value (i.e. greater than or equal to 0 V), and an erased condition is a condition where the threshold value $V_{TH}$ is a negative value (less than 0 V). It should be noted that, in the NAND type EEPROM, the condition where the threshold value $V_{TH}$ of the memory cell is the positive value, is taken as a condition where "0" is written, and a condition where the threshold valve $V_{TH}$ of the memory cell is the negative value, as a condition where "1" is written, for example.

The operation of writing of data is started from the memory cell at the most distance from the bit line. To the control gate of the selected memory cell, a high voltage $V_{PP}$ (in the order of 20 V) is applied, and to the control gate of the memory cell at the bit line side from the selected word line and to the selection gate, a medium potential (on the order of 7 V to 10 V) is applied, and to the bit line, 0 V or the medium potential is applied depending upon the data to be written.

When 0 V is applied to the bit line, the potential is transmitted to the drain of the selected memory cell through the selection gate at the drain side to inject electrons to a floating gate from the drain. By this, the threshold value $V_{TH}$ of the selected memory cell becomes a positive value. Namely, for writing "0" data, a charge voltage of the bit line is set to 0 V, and high voltage in the order of 20 V is applied between the control gate of the selected memory cell and the channel for causing injection of electrons into the floating gate. Then, the threshold value $V_{TH}$ after writing of "0" data is controlled within a predetermined range (e.g. 0.5 V to 3.5 V).

On the other hand, when "1" data is written, since the already erased memory cell is in the condition of "1" (the threshold value $V_{TH}$ is negative), "1" is written while no change will be caused. However, since high voltage $V_{PP}$ has been applied to the control gate of the selected memory cell, 7 V as intermediate potential is applied to the bit line so as to avoid injection of electron into the floating gate. Namely, when 7 V as the intermediate potential is applied to the bit line, injection of electron from the drain into the floating gate will never be caused. Therefore, the threshold value $V_{TH}$ of the memory cell is held unchanged at the negative value.

As set forth above, in the NAND cell type, upon writing data, the memory cell serves as the transfer gate, it becomes necessary to maintain the threshold valve $V_{TH}$ after writing within a certain allowable range.

Therefore, for example, as disclosed in Japanese Unexamined Patent Publication No. Heisei 3-295098, a verification control circuit for verifying the threshold value of the memory cell after writing becomes necessary.

FIG. 1 shows the conventional NAND cell type EEPROM having the verification circuit.

Referring to FIG. 1, with respect to a memory cell array 501, a data latching circuit 505 and a sense amplifier 504 are provided for writing and reading data. A control gate control circuit 502 outputs a predetermined control signal corresponding to respective of writing, reading and verifying operations of data on a control gate line (word line) of the memory cell 501.

In the writing and verifying operation, the sense amplifier 504 and the data latching circuit 505 respectively perform sensing operation and latching operation of the data to be re-written according to a column address output from a column address generating circuit 503.

A data comparison circuit 506 has a function for comparing writing data latched by the data latching circuit 505 and data read out by the sense amplifier circuit 504 for each address to detect matching thereof and latch the result.

The output of the data comparison circuit 506 is supplied to a verification completion detecting circuit 507.

After writing operation according to data to be written, which is latched in the data latching circuit 505, writing verifying operation is performed by the control gate control circuit 502. In the verification by the control gate control circuit 502, if all of the written data are within a predetermined range of distribution of the threshold value, a data writing completion signal is obtained from the verifying completion detecting circuit 507.

When the data writing completion signal is not output, data writing operation and verifying operation are again performed. Upon re-writing, data is generated by a re-writing data generating circuit 508 having exclusive NOR logic.

Subsequently, re-writing of the re-writing data is performed via the data latching circuit 505.

Finally, the writing operation is terminated when a signal indicative of matching in the data comparison circuit 506 as a result of data verification is fed to the verifying completion detecting circuit 507.

As set forth above, in the conventional NAND cell type EEPROM, upon writing data, the verification control circuit is necessary for maintaining the distribution of the threshold values of the memory cells within an allowable threshold value range.

Therefore, in addition to the sense amplifier circuit connected to the bit line, the function for latching the data after comparison of the data in the data comparison circuit 506 and a re-writing data generating circuit 508 for generating a data for re-writing are provided. This becomes a cause of expansion of the chip area and to make the layout of circuits complicate.

On the other hand, in the conventional verification control circuit, it becomes necessary to read out the written data after writing, to feed the result of reading to the data comparison circuit which checks the read out data against the writing data, and to re-generate the writing data every time of occurrence of unmatching of the data compared, and to re-write the re-generated data. Therefore, the algorithm after writing becomes complicate and inherently causes a lowering of the throughput.

Further discussion will be given for drawbacks of the conventional NAND cell type EEPROM. FIG. 2 shows a process for writing 4 bits (four bit lines) simultaneously. Here, it is assumed that respective data of 0, 0, 0, 1 are applied to bit lines B1, B2, B3, B4. The data "0" means writing and data "1" means not writing.

At first, at step 1, data (0, 0, 0, 1) is externally input. At step 2, the input data (0, 0, 0, 1) is received in the data latching circuit 505. At step 3, data is written in the memory cell 501. At step 4, data is read out from the memory for verification.

Subsequently, at step 5, the read data is taken in a circuit other than the latching circuit of the step 2, such as a data latch in the comparison circuit. Then, at step 6, the data of the data latching circuit of step 2 and the data of the data latch of step 5 are compared by the data comparison circuit 506. As a result of data comparison, if the data are matched to each other, verification is terminated. However, when the data are not matched, the process is moved to next step 7.

At step 7, it is assumed that the read out data at step ≡which should be (0, 0, 0, 1) becomes (0, 0, 1, 1), due to insufficient writing in the bit line B3. Then, the data to be given in re-writing becomes (1, 1, 0, 1). Writing in the bit lines B1 and B2 are sufficient, and for such cells, writing in second and subsequent writing cycles is not performed in order to avoid fluctuation of the threshold value. Here, the data (1, 1, 0, 1) is generated by taking an exclusive NOR of (0, 0, 0, 1) and (0, 0, 1, 1). Therefore, the re-writing data generating circuit 508 becomes necessary.

At step 8, the process is returned to step 3 to perform writing of data generated at step 7.

In such conventional NAND cell type EEPROM, the latching circuit at step 5 and the re-writing data generating circuit 508 at step 7 become necessary. Therefore, such conventional circuit has the drawback of causing the enlargement of the chip area.

SUMMARY OF THE INVENTION

Therefore, it is an object of the present invention to provide a semiconductor non-volatile device which makes a data generation circuit for re-writing unnecessary, can shorten overall writing period, and can make distribution range of threshold values of memory cells smaller.

According to the present invention, a semiconductor non-volatile storage device comprises:
a memory cell array including a plurality of memory cells arranged in a form of matrix, each of the memory cells having a charge accumulation layer and a control gate stacked on a semiconductor substrate for enabling electrical updating by increasing and decreasing of charge in the charge accumulation layer; and
means for applying an equal level of verification potential for all of bit lines of the memory cells and applying a predetermined verification potential to a selected control gate for performing re-writing for insufficiently written memory cells without generating data for re-writing per every verification by a logic circuit.

According to another aspect of the invention, a semiconductor non-volatile storage device comprises:
a memory cell array including a plurality of memory cells arranged in a form of matrix and connected in series to form NAND cell, each of the memory cells having a charge accumulation layer and a control gate stacked on a semiconductor substrate for enabling electrical updating by increasing and decreasing of charge in the charge accumulation layer; and
means, upon writing verification, for making ground potential to selected word line and applying an equal level of verification potential for all of bit lines of the memory cells, situating a source side selection electrode the ON state, subsequently situating the selected source side selection gate the OFF state, applying the verification potential only to bit lines of memory cells for which writing is not performed and making high potential to the selected word lines for re-writing data in the insufficiently written memory cells.

With the present invention, a function to latch the data after comparison of data in the data comparison circuit and a re-writing data generating circuit becomes unnecessary. Also, the verification algorithm after writing will not become complicated to shorten overall writing period. Also, it is possible to narrowe the range to distribute the threshold value of the memory cell.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail so as not to unnecessarily obscure the present invention.

Figure 3:
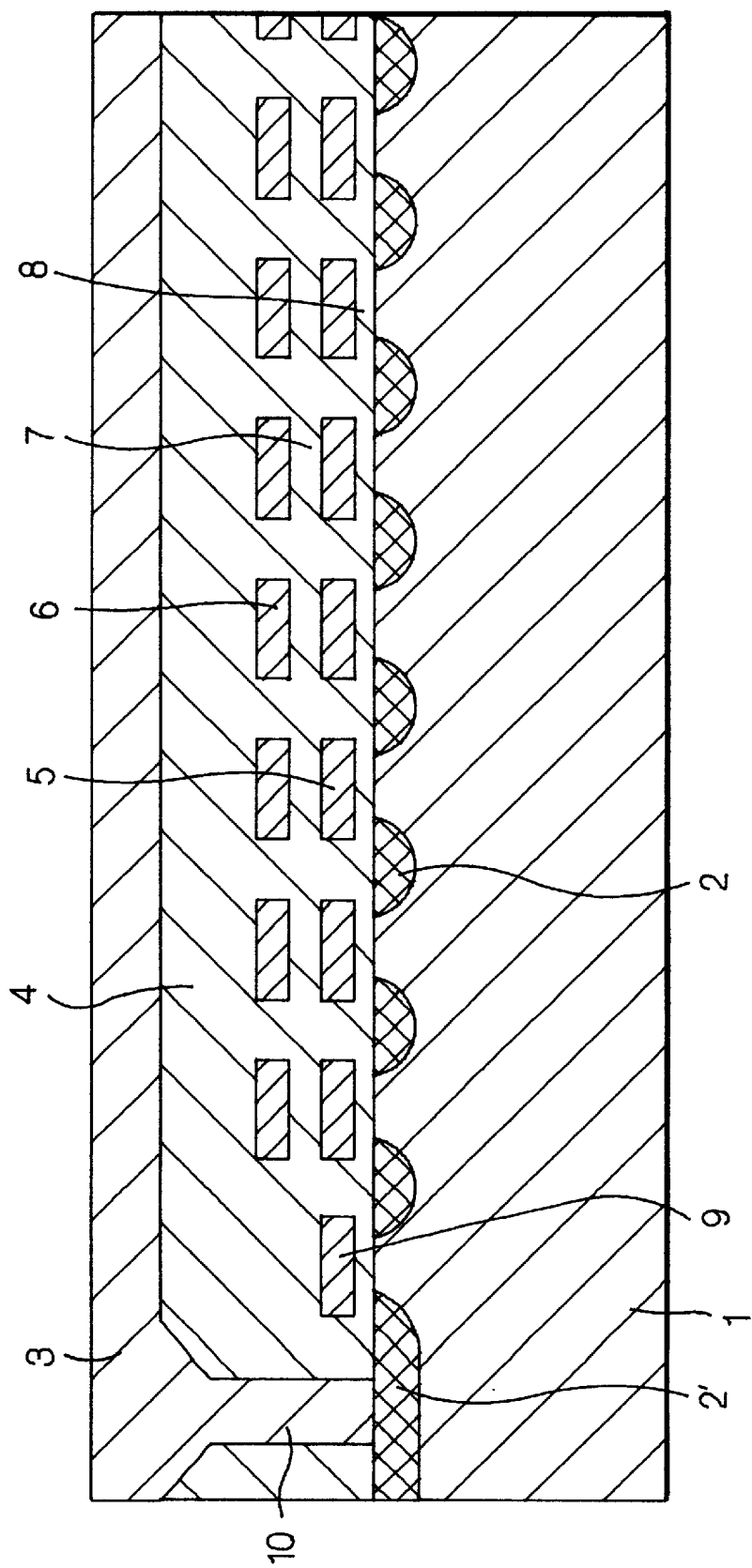
FIG. 3 is an illustration showing a section of one embodiment of the present invention.
Figure 4:
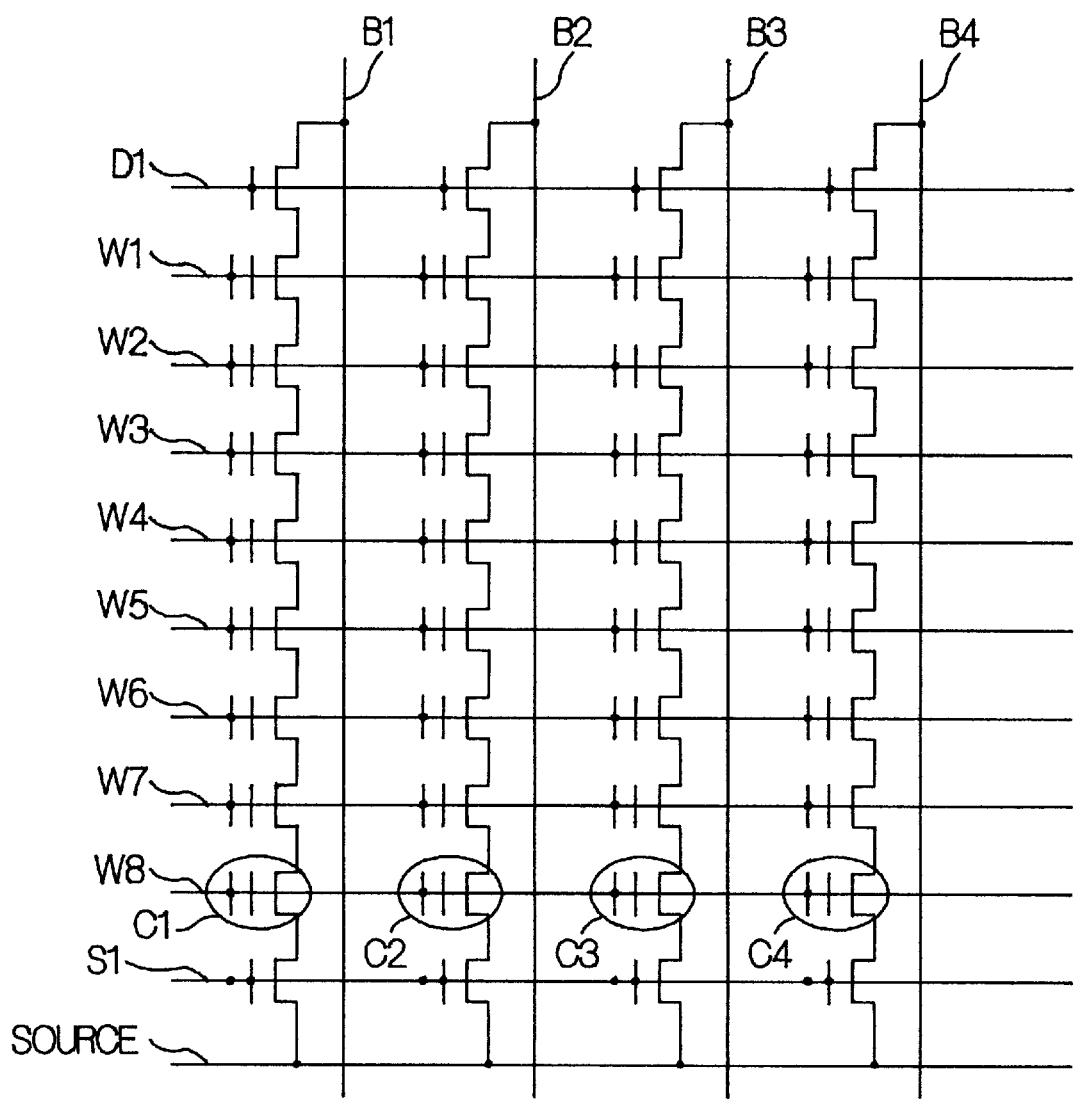
FIG. 4 is an illustration showing an equivalent circuit of a memory cell array of one embodiment of the invention.
Figure 5:
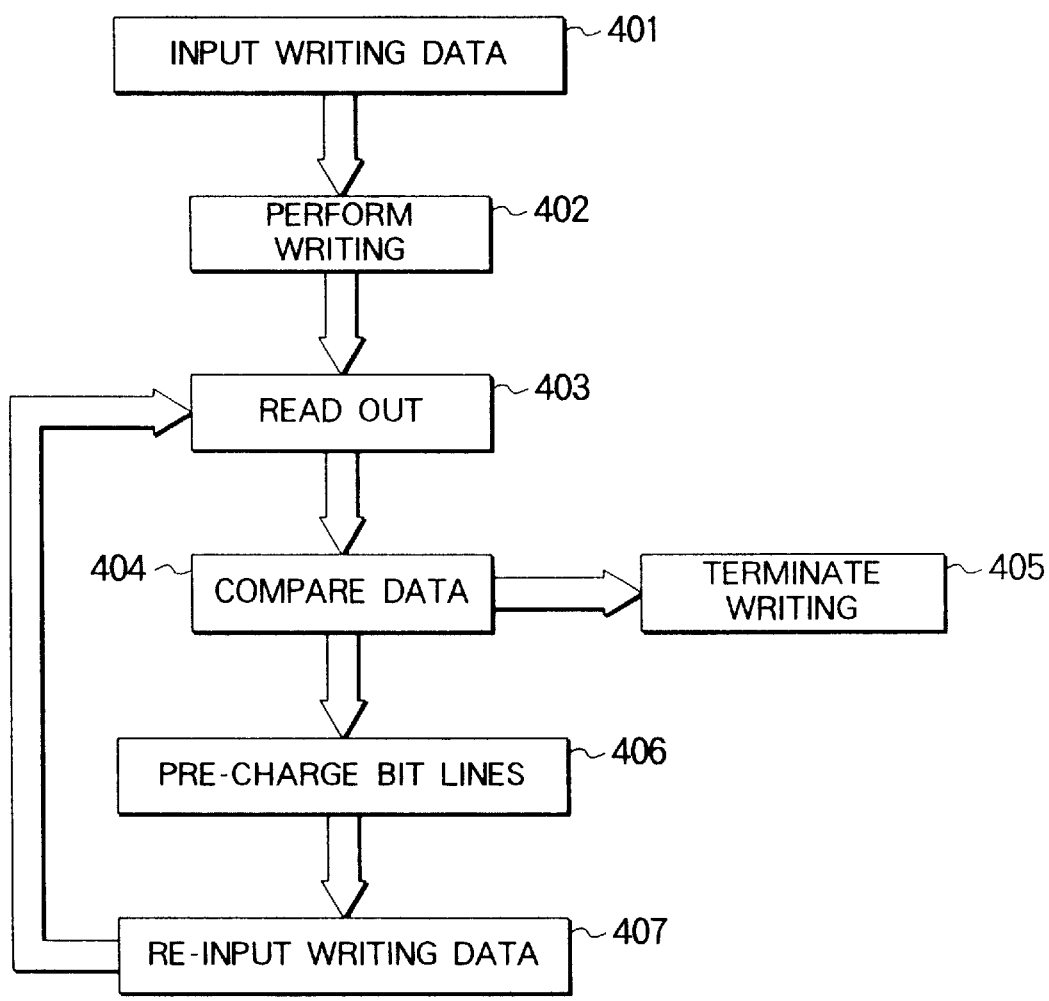
FIG. 5 is a block diagram showing a construction of one embodiment of the invention.

FIG. 3 is a cross section of one NAND cell portion of a memory cell array in the preferred embodiment. FIG. 4 shows an equivalent circuit of the memory cell array, in which NAND cells are arranged in a form of matrix. FIG. 5 is a flow-chart for explaining the writing algorithm in the shown embodiment.

Referring now to FIG. 3, a wiring layer 3 corresponds to bit lines B1, B2, B3 and B4 of FIG. 4. Through a contact hole 10 provided in an interlayer insulation layer 4, the wiring layer 3 and the drain 2' are connected. The transistor forms a drain side selection gate of the NAND cell, and a gate electrode 9 provided on a semiconductor substrate 1 via a gate oxide layer is connected to a selection gate signal DI of FIG. 4.

Then, between adjacent cells, one diffusion layer is owned common as a source region 2 of one of the cells and a drain region 3 of the other cell. On the other hand, a floating gate 5 is arranged on the semiconductor substrate 1 via a tunnel gate insulation layer 8. On the floating gate 5, a control gate 6 is arranged via a gate insulation layer 7. A plurality of memory cells having stacked gate structure, in which the floating gate 5 and the control gate 6 are stacked in order, are connected to bit lines in series via drain side selection gates. It should be noted that the memory cells connected in series are connected to a source line via a source side selection gates.

Next, the operation of the shown embodiment will be discussed with reference to the equivalent circuit diagram of FIG. 4 and the following table 1, in which is shown potential of word lines and bit lines in each mode in writing operation.

TABLE 1

|    | WRITING | PRE-CHARGE | RE-WRITING |
|----|---------|------------|------------|
| B1 | 0 V.    | 7 V        | 7 V        |
| B2 | 0 V     | 7 V        | 7 V        |
| B3 | 0 V     | 7 V        | 0 V        |
| B4 | 7 V     | 7 V        | 7 V        |
| D1 | 10 V    | 10 V       | 10 V       |
| W1 | 10 V    | 10 V       | 10 V       |
| W2 | 10 V    | 10 V       | 10 V       |
| W3 | 10 V    | 10 V       | 10 V       |
| W4 | 10 V    | 10 V       | 10 V       |
| W5 | 10 V    | 10 V       | 10 V       |
| W6 | 10 V    | 10 V       | 10 V       |
| W7 | 10 V    | 10 V       | 10 V       |
| W8 | 20 V    | 0 V        | 20 V       |
| S1 | 0 V     | 10 V       | 0 V        |

In FIG. 4, it is assumed that data is written (threshold value $V_{TH}$ is positive value) in cells C1, C2 and C3 among memory cells C1, C2, C3 and C4, and no data is written (maintain erased condition where the threshold value $V_{TH}$ is negative value) in the memory cell C4.

At this time, the word line W8 becomes the selected control gate.

Upon initial writing, the voltages in the column "WRITING" of the foregoing table 1 are applied to respective wiring. Namely, with reference to the column "WRITING", the potentials to be applied to the bit lines B1, B2 and B3 connected to the memory cells C1, C2 and C3 to be written (to be written "0" data) are set at 0 V, and the potential to be applied to the bit line B4 connected to the memory cell C4, to which an intermediate voltage (7 V) is applied. Then, to the selected word line W8, a high potential (20 V) is applied to perform writing. At this time, the source side selection gate line S1 is set at 0 V, and the word lines W1 to W7 which are at the bit line side by the selected word line W8 are applied 10 V, and the selection gate line D1 at the drain side is also applied 10 V to make the selection gate conductive.

Next, the process enters into a verifying mode. It is assumed that the threshold value of the memory cells C1 and C2 are positive value, and the writing to the memory cell C3 is insufficient and whereby the threshold value $V_{TH}$ is not yet risen to the positive value. Namely, writing of "0" data is held incomplete.

Figure 6:
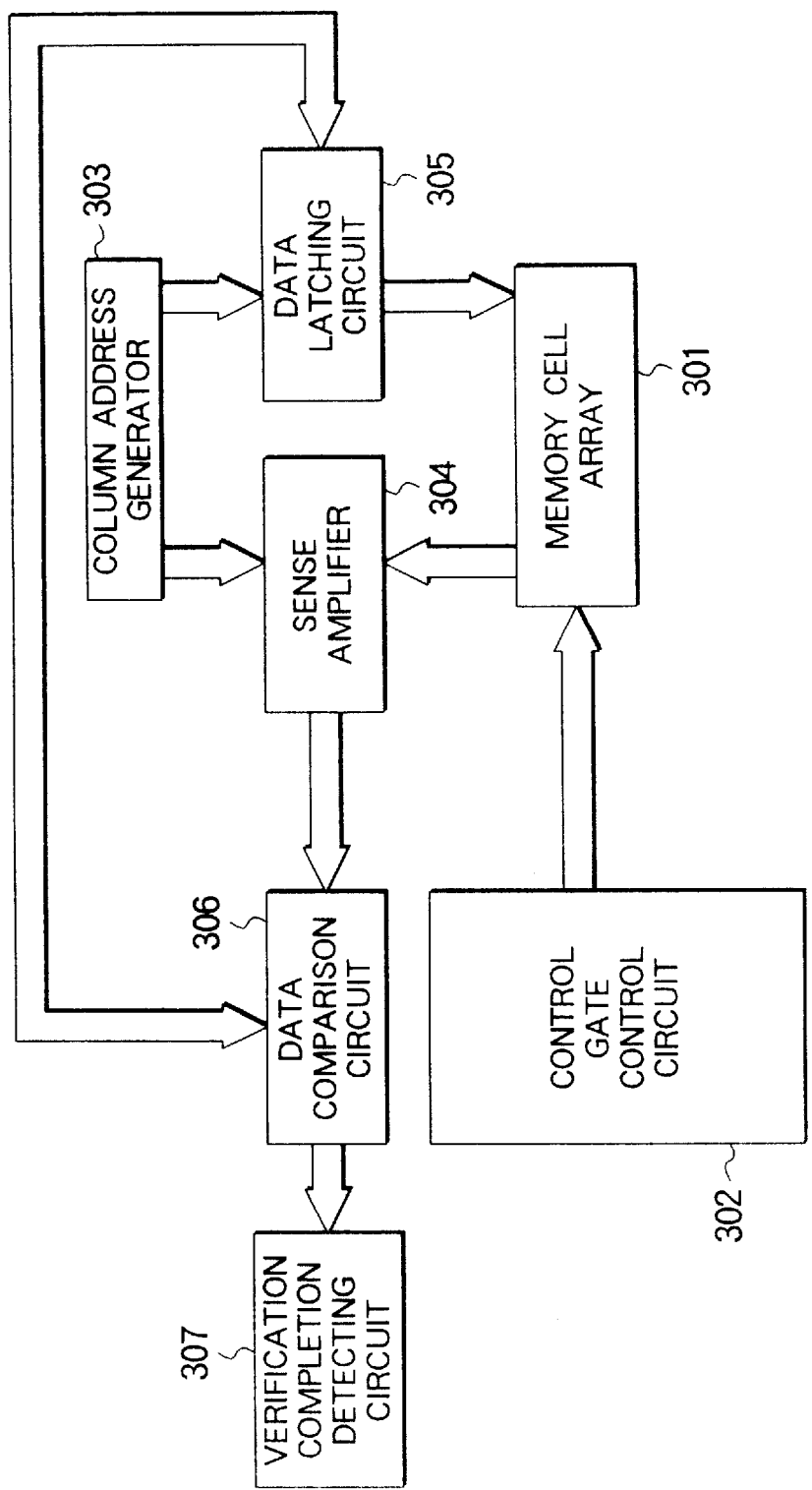
FIG. 6 is a flow-chart showing an algorithm of writing verification in one embodiment of the invention.

In the verifying mode, data is read out from the memory cell and the read data is compared with the data to be written (which is latched in the data latching circuit 305 of FIG. 6). If both data are matched together, the writing operation is terminated.

In this case, since writing for the memory cell C3 is insufficient, re-writing has to be performed.

For re-writing, the voltages to be applied in the column of "pre-charge" in the foregoing table 1 are applied to respective wirings. Namely, all of the bit lines B1 to B4 are pre-charged at the intermediate voltage of 7 V. Also, to the source side selection gate S1, high level (10 V) is applied.

At this time, the word line 8 is set at zero, and the threshold values of the memory cells C1 and C2 which are written are positive values, the memory cells C1 and C2 are not ON as transfer gate. Therefore, the potential of the bit lines B1 and B2 are held at the intermediate potential, i.e. 7 V.

On the other hand, when the memory cell C3, for which writing was insufficient and the memory cell C4, for which writing was not performed have the threshold values $V_{TH}$ of negative values. Therefore, the transfer gates thereof are held ON to connect the bit lines B3 and B4 to the source line (grounding potential) via the selection gate at the source side. Therefore, the potentials at the bit lines B3 and B4 become substantially 0 V.

Next, a writing data (the intermediate potential, i.e. 7 V in this case) is fed only to the bit line B4 connected to the memory cell C4 which has not been written, and no data is applied to the bit lines B1, B2 and B3 connected to the memory cells C1, C2 and C3 which are to be written. As a result, a gate connecting the data latching circuit 305 and the memory cell array 301 is turned OFF.

The potentials to be applied to respective wirings at this time are shown in the column of "re-writing" in the foregoing table 1. With reference to the column of "re-writing", 7 V at the bit lines B1 and B2 are not applied but are the residual potential in pre-charging. Then, as set forth above, only potential of 7 V is applied externally to the bit line B4.

At this condition of the bit lines, if the potential at the word line W8 is risen to high potential (20 V), only memory cell C3 which is insufficient writing condition is caused to be in writing mode. Thus, 0 V is applied to the memory cell C3 through the bit line B3 to perform writing (writing of "0" data).

FIG. 6 shows a construction of the shown embodiment of the NAND cell type EEPROM.

Referring to FIG. 6, the shown embodiment of the NAND cell type EEPROM is provided with a data latching circuit 305 and a sense amplifier circuit 304 for writing and reading of data. A control gate control circuit 302 outputs predetermined control signals corresponding to data writing, erasing, reading out and verifying operation to the control gate line (word line).

The sense amplifier circuit 304 and the data latching circuit 305 respectively perform sensing operation and latching operation of the data to be written according to column address output from a column address generation circuit 303 upon writing and verifying operation.

A data comparison circuit 306 compares the writing data latched in the data latching circuit 305 and the data read out from the sense amplifier circuit 304 to check whether these two data are matched to each other, and latches the result of comparison. The output of the data comparison circuit 306 is introduced into a verification completion detecting circuit 307.

Referring to FIGS. 5 and 6, the verification algorithm after writing in the shown embodiment will be discussed.

After writing operation according to the writing data latched in the data latching circuit 305 (step 402), data is read out from the memory cell array 301 for writing verifying operation (step 403). When all of the writing data are within a desired threshold value distribution range, a data writing completion signal is issued by a verification completion detecting circuit 307 (step 405).

When the data writing completion signal is not output, data writing operation and verification operation are repeated.

Upon re-writing operation, all of the bit lines are pre-charged at a predetermined verification potential (e.g. medium potential of 7 V) (step 406). Subsequently, the writing data of the data latching circuit 305 is transferred to the memory cell array 301 (step 407). At this time, as set forth above, writing data is transmitted from the data latching circuit 305 to the bit lines connected to the memory cells for which data writing should not be performed.

Finally, in the data comparison circuit 306, the writing operation is terminated when a signal indicative of matching as a result of data comparison (step 405).

Figure 7:
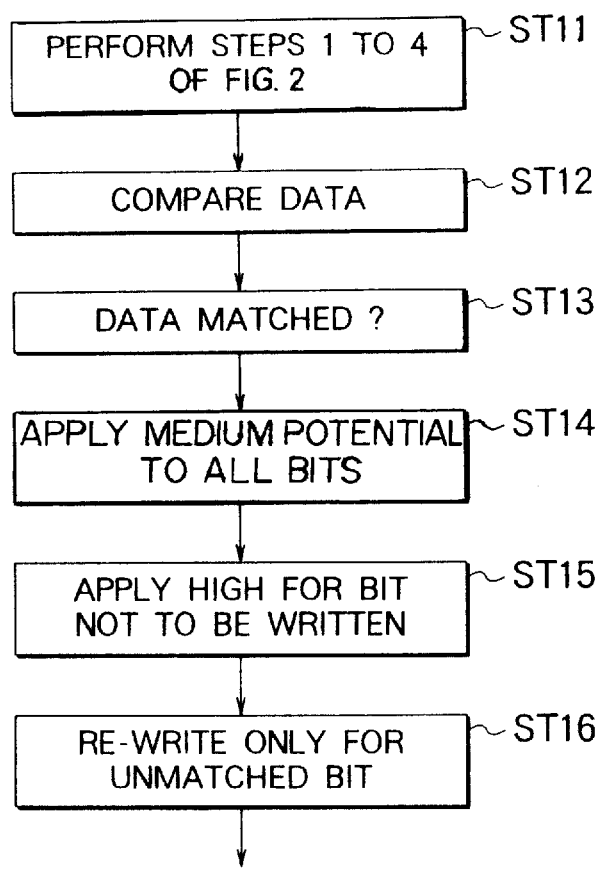
FIG. 7 is a flow-chart for explaining the effect of the shown embodiment.

Further discussion will be given for verifying operation of the shown embodiment with reference to the flow-chart in FIG. 7 in order to explain the effect of the present invention. Similarly to the case of FIG. 2, it is assumed that writing is performed simultaneously for four bit lines, and 0, 0, 0, 1 are written in the bit lines B1, B2, B3, B4.

Figure 1:
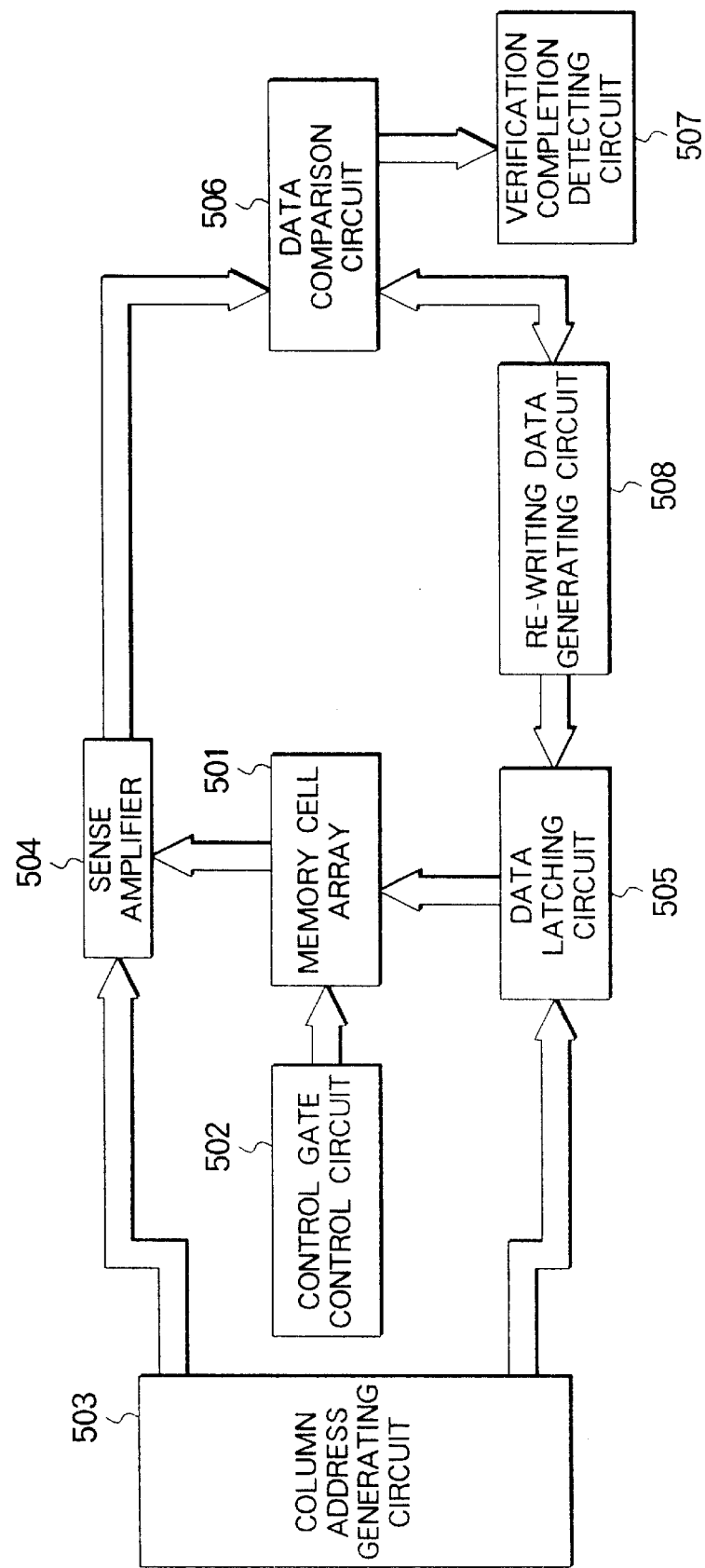
FIG. 1 is a block diagram showing a construction of the conventional NAND cell type EEPROM having a verification control circuit.
Figure 2:
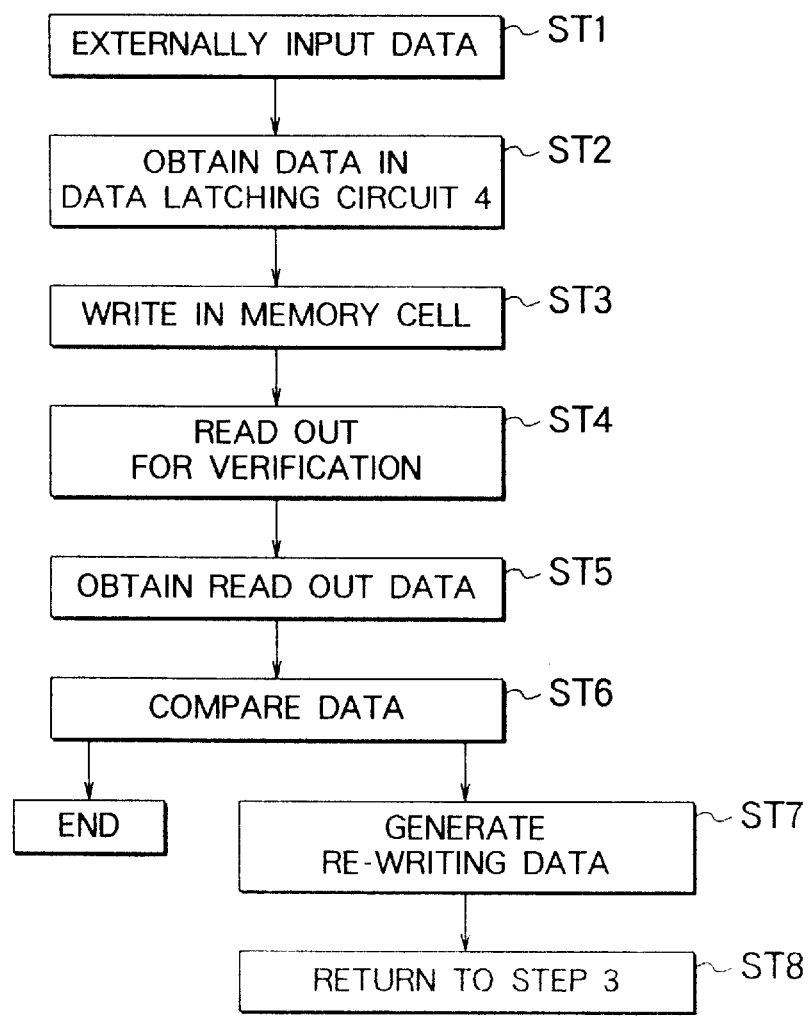
FIG. 2 is a flow-chart showing a process performed by the conventional circuit.

Step 11 is the same as steps 1 to 4 in the conventional process as illustrated in FIG. 2. At step 12, the read out data for verification will not be used later, and thus is directly applied to the data comparison circuit 306 to perform data comparison.

Next, at step 13, when the read out data is (0, 0, 1, 1) and thus does not match with the written data (0, 0, 0, 1), the process is advanced to the next step irrespective of the content of the read out data.

Namely, at step 14, the medium potential (7 V) is applied to all bits. Then, the bit lines B1, B2 become high and the bit lines B3 and B4 become low level since the threshold values thereof are low.

Then, at step 15, utilizing the data of the data latching circuit 305, high potential is applied to the bit line B4 which is not designated to be written. Also, at step 16, the selected word line is applied a high potential to rewrite only the bit line B3.

Thus, in the shown embodiment, at step 15, the data on the data latching circuit 305 is used to apply high potential to the bit line B4 which is not designated to be written the data. For this purpose, the control circuit 302 becomes necessary. However, the latching circuit at step 5 in FIG. 2 and the re-writing data generating circuit 508 become unnecessary. Since the control circuit 302 can be made smaller than the latching circuit and the re-writing data generating circuit 508, the chip area can be reduced. It should be noted that while (Low, Low, Low, High) is applied upon re-writing (0, 0, 0, 1) , (Open, Open, Open, High) may be a replacement for the former writing data.

As set forth above, according to the present invention, without providing a function for latching after comparison of data in the data comparison circuit and the re-writing data generating circuit, and with shortening period of the overall writing, the NAND cell type EEPROM which permits to make the distribution of the threshold value of the memory cell smaller.

Furthermore, since the re-writing data generating circuit which has been inherent in the conventional system is not necessary in the present invention, the scale of the circuit can be made smaller and whereby to contribute to make the chip area smaller. Furthermore, according to the present invention, it becomes possible to perform verification per bit at high speed and to make the distribution of the threshold values $V_{TH}$ after writing smaller. Thus, it is further possible to lower the power source voltage, for example to 3.3 V.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A semiconductor non-volatile storage device comprising:

a memory cell array including a plurality of memory cells arranged in matrix form, each of said memory cells having a charge accumulation layer and a control gate stacked on a semiconductor substrate for enabling electrical updating by increasing and decreasing of charge in said charge accumulation layer; and means for applying an equal level of verification potential to all bit lines of said memory cells and applying a predetermined verification potential to a selected control gate for simultaneously performing re-writing only to insufficiently written memory cells.

2. A semiconductor non-volatile storage device comprising:

a memory cell array including a plurality of memory cells arranged in matrix form and connected in series to form a NAND cell, each of said memory cells having a charge accumulation layer and a control gate stacked on a semiconductor substrate for enabling electrical updating by increasing and decreasing of charge in said charge accumulation layer; and means, upon writing verification, for applying a ground potential to selected word lines and applying an equal level of verification potential to all bit lines of said memory cells, situating a source side selection electrode in an ON state, subsequently situating said selected source side selection gate into an OFF state, applying said verification potential only to bit lines of memory cells for which writing is not performed and applying a high potential to said selected word lines for simultaneously re-writing data only to insufficiently written memory cells.

3. A semiconductor non-volatile storage device comprising:

a memory cell array including a plurality of memory cells arranged in matrix form each of said memory cells having a charge accumulation layer and a control gate stacked on a semiconductor substrate for enabling electrical updating by exchanging of charge between said charge accumulation layer and said substrate; and means for applying an equal level of verification potential to all bit lines of said memory cells and applying a predetermined verification potential to a selected control gate for simultaneously performing re-writing only to insufficiently written memory cells.

4. A semiconductor non-volatile storage device comprising:

a memory cell array including a plurality of memory cells arranged in matrix form and connected in series to form a NAND cell, each of said memory cells having a charge accumulation layer and a control gate stacked on a semiconductor substrate for enabling electrical updating by exchanging of charge between said charge accumulation layer and said substrate; and means for applying an equal level of verification potential to all bit lines of said memory cells and applying a predetermined verification potential to a selected control gate for simultaneously performing re-writing only to insufficiently written memory cells.

5. A semiconductor non-volatile storage device comprising:

a memory cell array including a plurality of memory cells arranged in matrix form, each of said memory cells having a charge accumulation layer and a control gate stacked on a semiconductor substrate for electrically updating by exchanging of charge between said charge accumulation layer and said substrate; and means for applying an equal level of verification potential to all bit lines of said memory cells and applying a predetermined verification potential to a selected control gate for simultaneously performing re-writing only to insufficiently written memory cells.

* * * * *